(12) United States Patent
Komatsu et al.

(10) Patent No.: US 8,670,967 B2
(45) Date of Patent: Mar. 11, 2014

(54) SIMULATION METHOD, SYSTEM AND ARTICLE OF MANUFACTURE

(75) Inventors: Hideaki Komatsu, Kanagawa-ken (JP);
Fimitomo Ohsawa, Kanagawa-ken (JP);
Shuichi Shimizu, Kanagawa-ken (JP)

(73) Assignee: International Business Machines Corporation, Armonk, NY (US)

( * ) Notice: Subject to any disclaimer, the term of this patent is extended or adjusted under 35 U.S.C. 154(b) by 213 days.

(21) Appl. No.: 13/255,938

(22) PCT Filed: Mar. 10, 2010

(86) PCT No.: PCT/JP2010/054056
§ 371 (c)(1),
(2), (4) Date: Oct. 18, 2011

(87) PCT Pub. No.: WO2010/104135
PCT Pub. Date: Sep. 16, 2010

(65) Prior Publication Data
US 2012/0029893 A1   Feb. 2, 2012

(51) Int. Cl.
*G06F 17/50* (2006.01)

(52) U.S. Cl.
USPC ............................................. 703/13; 703/23

(58) Field of Classification Search
USPC .................... 703/6, 7, 13, 23; 73/146; 434/29
See application file for complete search history.

(56) References Cited

U.S. PATENT DOCUMENTS

| | | | |
|---|---|---|---|
| 5,678,028 | A | 10/1997 | Bershteyn et al. |
| 6,425,762 | B1 * | 7/2002 | Ernst ............................. 434/29 |
| 2002/0138245 | A1 * | 9/2002 | Yasuda ........................... 703/19 |
| 2005/0268708 | A1 * | 12/2005 | Satou et al. ..................... 73/146 |
| 2006/0047494 | A1 | 3/2006 | Tamura et al. |
| 2007/0192076 | A1 * | 8/2007 | Boutin ........................... 703/13 |

FOREIGN PATENT DOCUMENTS

| | | |
|---|---|---|
| JP | 08-227367 | 9/1996 |
| JP | 2001-290860 | 10/2001 |
| JP | 2003228496 | 8/2003 |
| JP | 2004-30228 | 1/2004 |
| JP | 2006-65758 | 3/2006 |
| JP | 2007052580 | 3/2007 |
| JP | 2008065640 | 3/2008 |

OTHER PUBLICATIONS

Syunichi Nakayama, "Launching of verification tools one after another in expectation of the expansion of the system ASIC market", NIKKEI Electronics, Nikkei Business Publications, Inc., Sep. 1, 1997, No. 697, pp.

Kazuo Taki, "Realization of large-scale general-purpose parallel processing", bit, Kyoritsu Shuppan Co., Ltd., Feb. 1, 1991, vol. 23, No. 2, pp. 35-50.

* cited by examiner

*Primary Examiner* — Kandasamy Thangavelu
(74) *Attorney, Agent, or Firm* — Vazken Alexanian

(57) ABSTRACT

A simulation system, method, and article of manufacture. A simulation system has a discrete and a continuous portion. The discrete portion further has a peripheral emulator in communication with the continuous portion of the simulation system. A portion of a peripheral emulator is separated and is caused to operate in a thread of a continuous system. The continuous system and the peripheral are in loose synchronization and therefore sparsely communicate with each other. The configuration significantly reduces the frequency of inter-thread communications between the continuous system and the discrete system that are performed in response to a continuous clock in a simulation system including the continuous system and the discrete system, thereby reducing communication cost. Accordingly, the operation speed of the simulation system can be increased.

19 Claims, 11 Drawing Sheets

SIMULATION METHOD, SYSTEM AND ARTICLE OF MANUFACTURE

CROSS-REFERENCE TO RELATED APPLICATION

This application is a U.S. National Stage entry under 35 U.S.C. §371 based on International Application No. PCT/JP2010/054056, filed Mar. 10, 2010, published under PCT Article 21(2) on Sep. 16, 2010 as WO2010/104135, which claim priority to Japanese Patent Application No. 2009-059790, filed Mar. 12, 2009.

BACKGROUND OF THE INVENTION

1. Field of the Invention

The present invention relates to a simulation of a physical system such as an automobile. In particular the present invention relates to a simulation system, method, and article of manufacture in which a continuous simulator and discrete-event simulators are improved by loosely synchronizing the simulators thereby reducing the frequency and cost of inter-thread or inter-processor communication.

2. Description of Related Art

Automobiles in the early years of the 20th century were made up of mechanical parts, including an engine, which is a power source to move the automobile, a brake, an accelerator, a steering wheel, a transmission, and a suspension, and used few electrical mechanisms; exceptions include spark ignition of the engine and a headlight.

Electronic control units (ECUs) have come into use for controlling engines in about the 1970s because of the need for efficiently controlling engines in order to reduce air pollution and in preparation for oil crunch. An ECU typically includes an input interface which converts an analog input signal coming from a sensor to a digital signal, a logic unit (microcomputer) which processes the digital input signal according to a predetermined logic, and an output interface which converts the processed signal to an actuator activation signal.

In addition to mechanical components, electronic components and software form a significant proportion of engine and transmission control systems, Anti-lock Braking Systems (ABSs), Electronic Stability Controls (ESCs), and power steering as well as wiper control and security monitoring systems of today's automobiles. Development costs relating to the electronic components and software are said to be 25 or 40% of the total development cost and make up 70% of the development cost for hybrid electric vehicles.

Electronic control is accomplished by providing multiple ECUs. The ECUs are interconnected through an in-vehicle network, for example a Controller Area Network (CAN). The components such as the engine and transmission which are to be controlled are directly connected to their respective ECUs through wires.

An ECU is a small computer that operates in response to an interrupt from a sensor input and the like. The engine and other components, on the other hand, are continuously mechanically operating. That is, digital systems, which are computer systems, and physical systems, which are mechanical systems, are cooperating simultaneously in the single system of the automobile. Naturally, the complexity of software that supports the cooperation is increasing. Therefore, there is demand for implementation of a mechanism that not only separately tests operation of each ECU but also tests multiple ECUs simultaneously.

On the other hand, actuators such as electromagnetic solenoids and motors are driven by signals output from the ECUs. Solenoids are used in an engine injector, the shift control of the transmission, brake valve controls, and door locks.

A conventional technique used for such tests is Hardware In the Loop Simulation (HILS). An environment in which the ECUs of a whole automobile are tested in particular is called Whole Vehicle HILS (Whole Vehicle Hardware In the Loop Simulation). In the whole vehicle HILS, real ECUs are connected to a dedicated hardware device that emulates components, such as an engine and a transmission mechanism in a laboratory, and tests are conducted according to predetermined scenarios. Outputs from the ECUs are input into a monitoring computer and are displayed on a display. A person responsible for the testing checks the outputs displayed on the display for an abnormal operation.

However, HILS involves burdensome preparations because it uses the dedicated hardware device, which needs to be physically connected to each real ECU. Furthermore, when an ECU is replaced with another one for testing, again the ECU needs to be physically connected to the dedicated hardware device, which is time-consuming. Moreover, testing requires actual time since real ECUs are used. Accordingly, testing many scenarios takes huge amounts of time. In addition, the hardware devices for HILS emulations in general are very expensive.

Therefore, more recently a method in which simulations are configured by software without using expensive emulation hardware devices has been made available. In the method, called Software In the Loop Simulation (SILS), all elements such as microcomputers and input/output circuits contained in ECUs as well as control scenarios are all formed by software simulators. This enables test to be conducted without the hardware of the ECUs.

A simulation system for automobile includes continuous simulators and discrete-event simulators. An example of the continuous simulator is a simulator that simulates a mechanical section of an engine. An example of discrete-event simulator is a simulator for an ECU that operates with the timing of a pulse of engine rotation to control the timings of fuel injection and ignition.

An example of continuous simulator that simulates a 4WD is a simulator that repeatedly calculates operation of the vehicle from torque apportioned to each wheel. An example of discrete-event simulator for 4WD is a simulator that operates with pulsed signals at regular intervals of 10 milliseconds, and that simulates an ECU that determines torque to be apportioned to each wheel from a sensor input such as the yaw rate of the vehicle.

In addition to receiving the pulse signal, the discrete-event simulator reads and writes data through an I/O port asynchronously to a time slice of the continuous simulator. Typically, the discrete-event simulator reads and updates data from a sensor.

FIG. 1 illustrates a block diagram of a configuration of a typical conventional discrete-event/continuous simulation system. The discrete-event simulator of the system includes ECU emulators 102, 104 and 106. While the system in practice includes more ECU emulators, only three ECU emulators are depicted for illustrative purposes.

Since the ECU emulators 102, 104 and 106 are substantially identical in function to one another, only the ECU emulator 102 will be described as a representative example. The ECU emulator 102 includes a CPU emulator 102a and a peripheral emulator 102b. The CPU emulator 102a is a module that emulates a logical function of a real ECU.

The peripheral emulator 102b receives a continuous pulse signal from a plant simulator 108, which is a continuous simulator such as an engine simulator, converts the continuous pulse signal to an interrupt event signal, passes the interrupt event signal to the discrete CPU emulator 102a, or converts an interrupt event signal received from the CPU emulator 102a to a continuous pulse signal.

Enclosed in the dashed rectangular blocks in FIG. 1 are individual threads of a simulation program. The individual threads are preferably allocated to individual cores or processors in a multi-core or multiprocessor environment.

FIG. 2 illustrates a timing chart of communications between the ECU emulators 102, 104 and 106 and the plant simulator 108. As can be seen from FIG. 2, the ECU emulator, which is a discrete system, and the plant simulator, which is a continuous system, in the configuration in FIG. 1 are in synchronization with each other at clock intervals.

However, inter-thread communication occurs at every clock pulse because the plant simulator 108 and the ECU emulators 102, 104 and 106 are executed in different threads as can be seen from the dashed blocks in FIG. 1. If the individual threads are assigned to separate cores or processors for parallel execution, inter-processor communication occurs. The inter-thread communication or the inter-processor communication that occurs once every clock interval involves enormous cost, which inhibits improvement of the speed of operation of the simulation system.

Japanese Published Unexamined Patent Application No. 2001-290860 aims to provide a hardware/software cooperative simulator to improve the speed of simulation by finding an unnecessary synchronization process between simulators and reducing the synchronization process, and discloses a simulator including simulation coordinating means for synchronizing CPU simulation means and peripheral circuit simulation means and determination means for determining whether or not to suppress synchronization in the simulation coordinating means, wherein the synchronization in the simulation coordinating means is suppressed according to the determination means.

Japanese Published Unexamined Patent Application No. 8-227367 aims to provide a debugger that uses a fast simulator that ignores all system operations excluding system operations in which design errors are expected to appear to increase the speed of debugging, and discloses a debugger including a bus simulator of a bus providing a signal corresponding to a bus cycle for interconnecting simulators and means for omitting a bus cycle unnecessary for simulation, wherein a CPU bus cycle irrelevant to simulation is omitted or a periodic clock signal is explicitly avoided from being simulated so that only a schedule of the clock signal is generated.

Japanese Published Unexamined Patent Application No. 2004-30228 discloses a simulator including a CPU simulator, one or more peripheral macro-simulators, and synchronous execution control processing unit controlling synchronous execution of these, wherein the peripheral macro-simulator (s) execute simulation based on a terminal signal when the terminal signal, which is input to a terminal on the basis of simulation in the CPU simulator, has changed. The peripheral macro-simulator(s) detect a change in the input terminal signal, registers the changed terminal signal on a terminal signal list 22, and performs simulation only for the registered terminal signal.

Japanese Published Unexamined Patent Application No. 2006-65758 discloses a circuit simulation method, wherein a response function is provided to a first discrete time model generated from circuit data to generate a second discrete time model, an edge timing of a clock and an effective signal value of a signal input into and output from a clock synchronization circuit at the timing are calculated using the second discrete model, and simulation is performed using these.

SUMMARY OF THE INVENTION

The existing techniques described above conditionally synchronizes simulators or find an edge timing of a clock in order to reduce the cost of communication between the simulators. However, none of the techniques adequately solve the problem of the cost of inter-thread communication or inter-processor communication between a continuous system and a discrete system in a simulation system.

Therefore, it is an object of the present invention to reduce the cost of communication between a continuous system and a discrete system in a simulation system.

It is another object of the present invention to provide a simulation system in which a continuous system and a discrete system appropriately operate with only infrequent synchronization between them.

To solve the problem described above, the inventors have made studies and focused attention on a peripheral portion of discrete-event simulators such as ECU emulators. As illustrated in FIG. 1, an ECU emulator includes a CPU emulator portion and a peripheral portion. The inventors considered that this is where the bottleneck of communication cost exists.

As a result of the studies, the inventors conceived the idea of allowing at least a portion of the peripheral of the ECU emulator to operate in the same thread as the continuous system. Since the continuous system and a portion of the peripheral operate in the same thread, the configuration achieves low communication cost.

Although inter-thread communication between the peripheral and the ECU emulator is still required, such communication occurs only sparsely such as at interrupt events or periodic access at long regular intervals and therefore places only a little load in terms of communication cost.

According to another feature of the present invention, a continuous system and a discrete system appropriately operate with only infrequent synchronization between them. Specifically, according to a first embodiment of the present invention, a discrete system operates independently of a clock of a continuous system. The discrete system can access a clock module of the continuous system and accesses the clock module only when the discrete system requires a time instant of the clock module. Accordingly, the system places little load in terms of communication cost.

According to a second embodiment of the present invention, a discrete system can access a clock module of a continuous system at a clock pulse out of a certain number of clock pulses (for example ¹⁄₁₀₀₀) of the continuous system for maintaining synchronization with the continuous system. The second embodiment is used when a software timer (time calculation) is used in the discrete system. Operation of the software timer is guaranteed by synchronization at intervals smaller than the minimum granularity of the software timer.

According to the present invention, the frequency of inter-thread communications between a discrete system and a continuous system is significantly reduced since at least a portion of a peripheral of the discrete system is incorporated in the continuous system so that the portion operates in the same thread as the continuous system. Accordingly, the cost of inter-thread communication is significantly reduced to remarkably improve the operation speed of the simulation system.

DETAILED DESCRIPTION OF THE PREFERRED EMBODIMENTS

Figure 1:
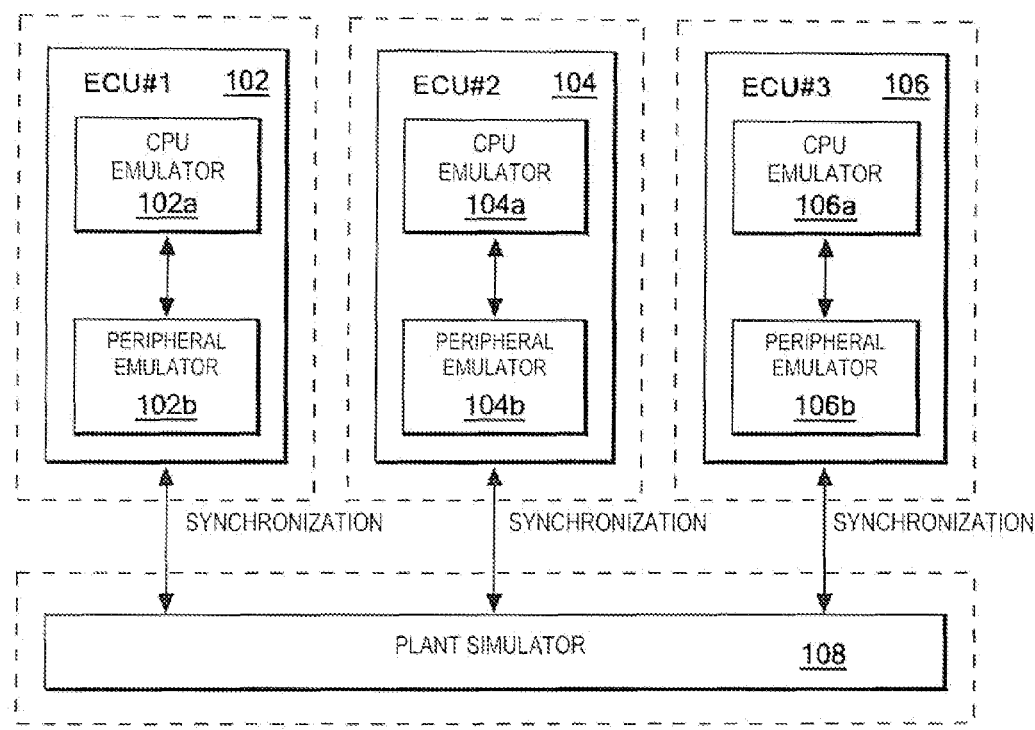
FIG. 1 illustrates a functional block diagram of a typical conventional simulation system including a discrete system and a continuous system.
Figure 2:
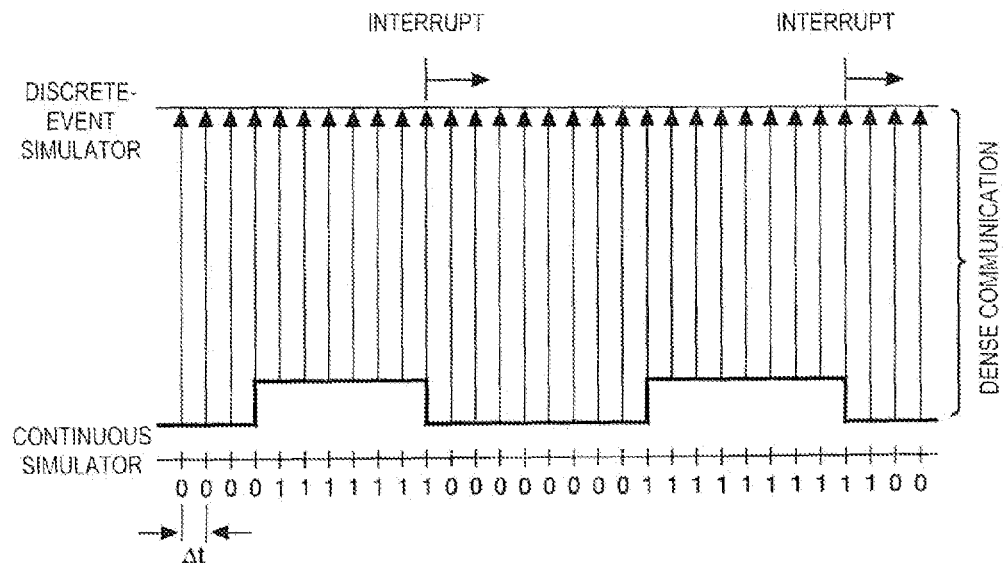
FIG. 2 illustrates a timing chart of the simulation system in FIG. 1.

A configuration and processes of embodiments of the present invention will be described below with reference to drawings. Like elements are given like reference numerals in the following description and throughout the drawings unless otherwise specified. Configurations and processes described herein are provided as exemplary embodiments and are not intended to limit the technical scope of the present invention to the embodiments.

Prior to describing a configuration for carrying out the present invention, an ECU will be described for understanding of the present invention. An ECU in general includes an input interface which converts an analog signal input from a sensor to a digital signal, a logic unit (microcomputer) which processes the digital input signal according to a predetermined logic, and an output interface which converts the processed signal to an actuator activation signal.

For convenience of explanation, the present invention will be described with respect to ECUs for automobile. However, it should be understood that the present invention is not limited to this and is applicable to mechatronics mechanisms in general such as aircraft and robots that have other ECUs.

ECUs receive as signals the status of surroundings and an environment, the status of a driving mechanism such as an engine, and instructions and actions from a human operator detected by sensors. Specifically, examples of signals include signals from a water temperature sensor, an inlet temperature sensor, a charging pressure sensor, a pump angle sensor, a crank angle sensor, a vehicle speed sensor, an accelerator position sensor, an A/T shift position, a starter switch, and an air conditioner ECU.

The ECUs receive the signals and output signals that drive components such as an electromagnetic spill valve, a fuel cut solenoid, a timing control valve, an inlet throttle VSV, a glow plug relay, a tachometer, and an air conditioner relay.

While it is not impossible to enable a single ECU to output drive signals for controlling different mechanisms, it is not efficient that a single CPU controls components that differ in responsivity and precision of control, such as an engine and an air conditioner. Therefore, typically multiple ECUs are provided in an automobile.

Figure 3:
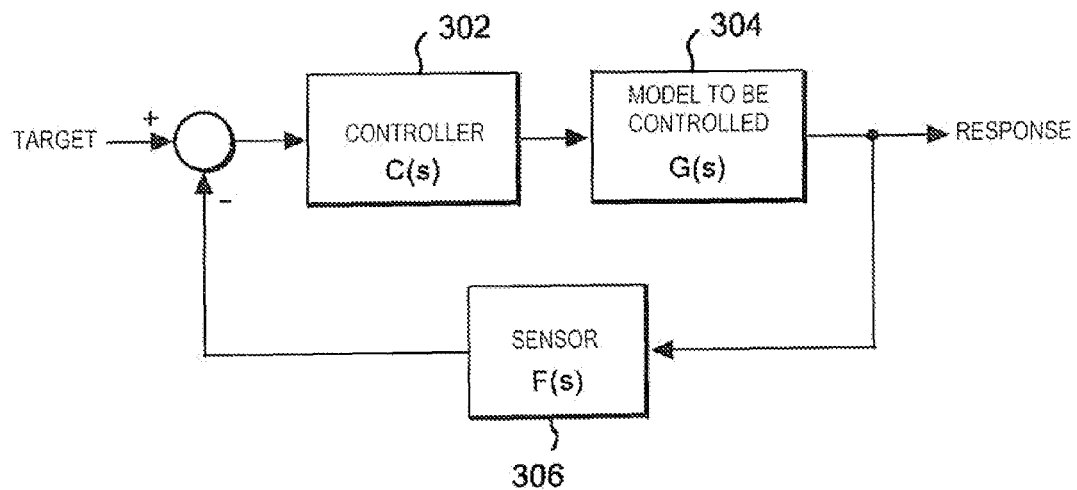
FIG. 3 illustrates an exemplary feedback closed loop system, which is a typical control of an ECU.

FIG. 3 illustrates an exemplary feedback closed loop system, which is a typical control of an ECU. In FIG. 3, a target signal is input into the controller 302, which is an ECU. The ECU internally processes the target signal to provide a drive signal, which drives a plant 304 such as an engine which is a model to be controlled. An output from the plant 304 is fed back to an input of the controller 302 through a sensor 306.

The target signal provided may be a parameter such as the degree of throttle opening, idle control, brake force, shift, starter on/off, battery voltage, injection energization time, the number of injection energizations, deposit, dwell angle, advance angle, inlet completion flag, ignition completion flag, atmospheric pressure, the weight of the vehicle, rolling resistance coefficient, road gradient, adhesion coefficient, and inlet temperature.

The sensor signal fed back may be the degree of throttle opening, inlet pressure, the amount of inlet air, shift, engine RPM, vehicle speed, exhaust temperature, $O_2$, cooling water temperature, air-fuel ratio, knock, or abnormal ignition.

The ECU may control a mechanical system that can be solved by a Newtonian mechanics equation or an electric drive circuit that can be solved by an electric circuit response equation, or a combination of these. They are basically differential equations. According to control engineering, these equations can be transformed by Laplace transform to response functions which can be described.

Figure 4:
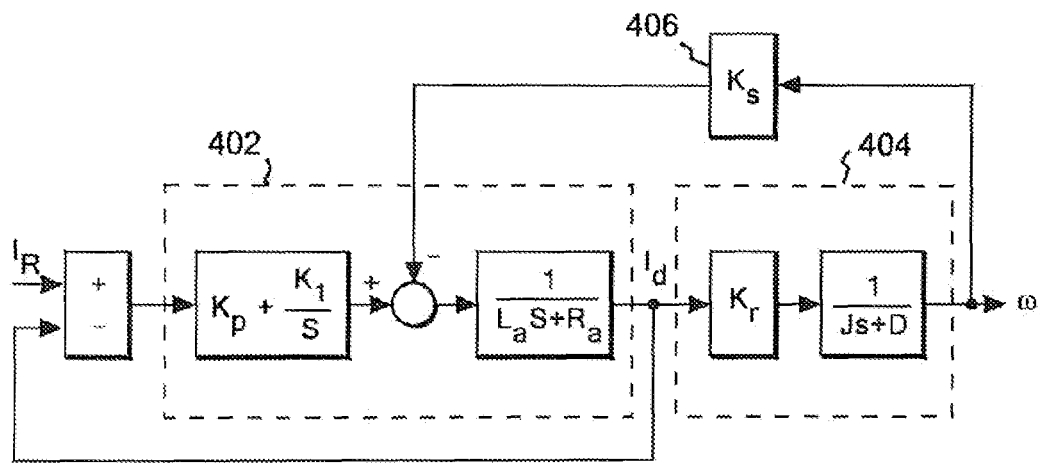
FIG. 4 illustrates an exemplary description of the feedback closed loop system using response functions.

FIG. 4 illustrates an exemplary description using such response functions. The block enclosed in a dashed box 402 in FIG. 4 corresponds to the controller 302 in FIG. 3, the block enclosed in a dashed box 404 corresponds to the model to be controlled 304, and the block 406 corresponds to the sensor 306. It should be understood that FIG. 4 illustrates an example of a representation using response functions and is not intended to limit the present invention.

Figure 5:
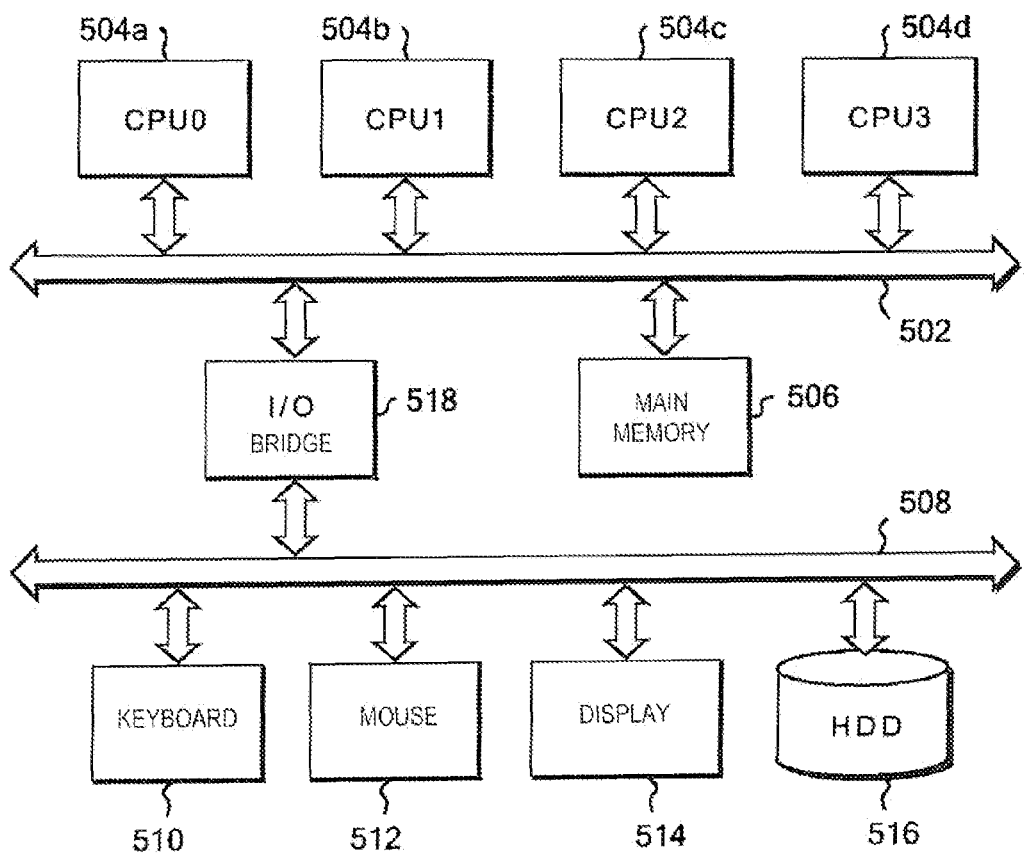
FIG. 5 is a block diagram of hardware of a computer used for carrying out the present invention.

Hardware of a computer used for carrying out the present invention will be described with reference to FIG. 5. In FIG. 5, multiple CPUs, CPU0 504a, CPU1 504b, CPU2 504c and CPU3 504d are connected onto a host bus 502. Also connected onto the host bus 502 is a main memory 506 used by CPU0 504a, CPU1 504b, CPU2 504c and CPU3 504d for computations.

A keyboard 510, a mouse 512, a display 514, and a hard disk drive 516 are connected onto an I/O bus 508. The I/O bus 508 is connected to the host bus 502 through an I/O bridge 518. The keyboard 510 and the mouse 512 are used by an operator for entering commands and performing operations such as clicking on a menu. The display 514 is used for displaying menus for operating a program according to the present invention, which will be described later, through a GUI as needed.

Preferable hardware of the computer system used for the present purpose is IBM (R) System X. For that case, CPU0 504a, CPU1 504b, CPU2 504c and CPU3 504d may be Intel (R) Core 2 DUO, for example, and an operating system may be Windows (trademark) Server 2003, for example. The operation system is stored in the hard disk drive 516 and is loaded from the hard disk drive 516 onto the main memory 506 during startup of the computer system.

While four CPUs are illustrated here, the number of CPUs is not limited to four. A single-processor system, or a multi-core or multi-processor system including any number of cores or processors may be used.

Hardware of the computer system that can be used for carrying out the present invention is not limited to IBM (R) System X; any computer system on which a simulation program of the present invention can be run can be used. The operating system is not limited to Windows (R); any operating system such as Linux (R) or Mac OS (R) may be used. Furthermore, in order to allow logical processes such as ECU emulator programs and plant simulators to operate fast, a POWER (trademark) 6-based computer system such as IBM (R) System P on which an AIX (trademark) operating system is running may be used.

Multiple logical processes such as ECU emulators and plant simulators, and a program for causing the multiple logical processes to cooperate are also stored in the hard disk drive 516 and can be activated and operated using the keyboard 510 and the mouse 512.

Preferably, emulator programs for all ECUs used in one automobile are stored in the hard disk drive 516 for implementing full-vehicle SILS.

Also stored in the hard disk drive 516 are a scheduler for ECU emulator programs, which will be described later, plant simulator programs for an engine, transmission, steering, wipers and other components, a global time manger for managing time instants for the whole system, and a scenario generator program containing scenarios for testing, such as upslope, express way, and winding road scenarios.

The terms "emulator" and "simulator" are used herein as follows. Causing an original ECU code intended to run on a different processor to run on a target such as CPU0 to CPU 3 is referred to as emulation and a program that performs such emulation is referred to as an emulator. A system that virtually computes operations of a physical system such as an engine is referred to as a simulator.

A functional logic block diagram of a simulation system according to the present invention including a discrete system and a continuous system will be described below with reference to FIG. 6. The discrete-event simulator of the system includes ECU emulators 602, 604 and 606. While the system actually includes more ECU emulators, only three ECU emulators are depicted for illustrative purposes.

Figure 6:
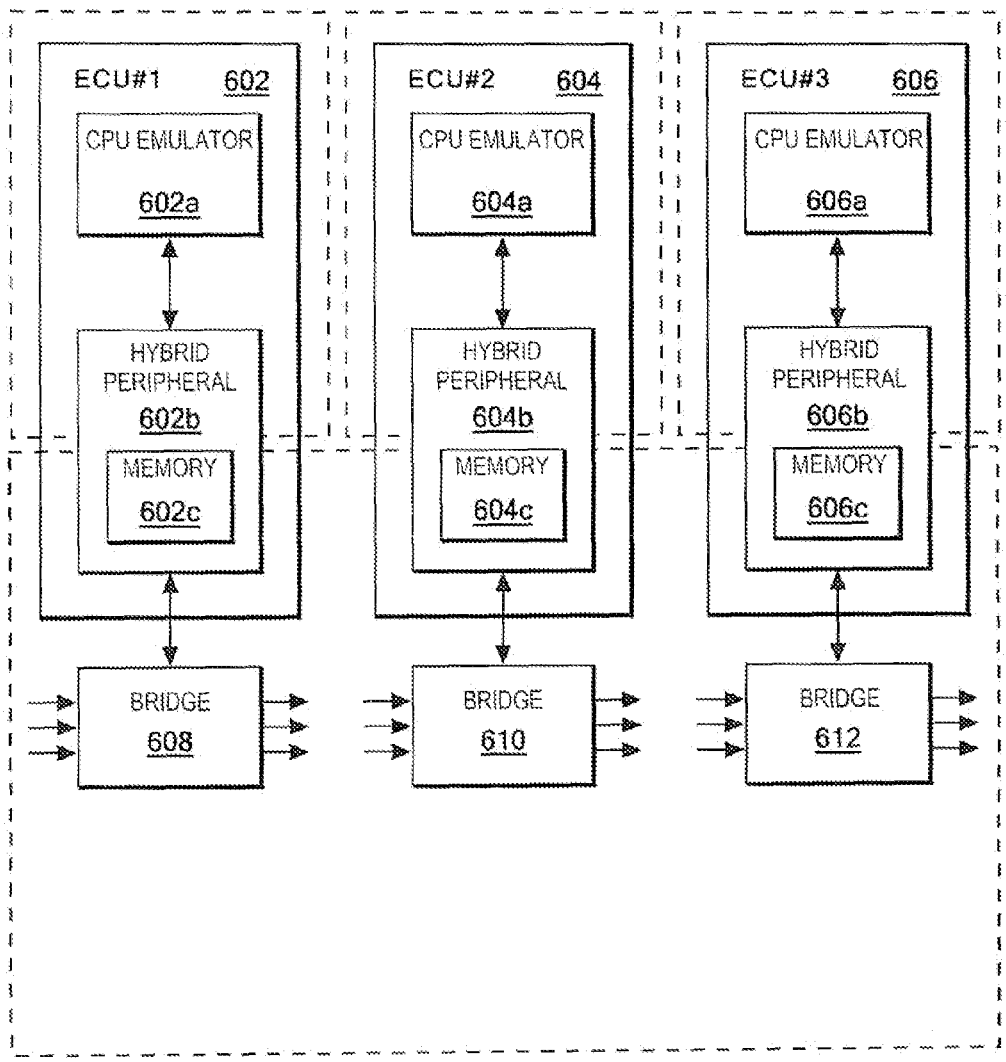
FIG. 6 illustrates a functional block diagram of a simulation system according to an embodiment of the present invention.

Program modules illustrated in FIG. 6 are stored in the hard disk drive 516, and are loaded from the hard disk drive 516 onto the main memory 506 during startup of the simulation system and run by operation of an operating system.

The ECU emulators 602, 604 and 606 are about identical to one another in function and therefore only the ECU emulator 602 will be described as a representative example. The ECU emulator 602 includes a CPU emulator 602a and a hybrid peripheral 602b.

Bridges 608, 610 and 612 are logic blocks each executes functions of a data input and output section of a plant simulator such as an engine simulator. The bridges 608, 610 and 612 communicate with the hybrid peripherals 602b, 604b and 606b, respectively, at intervals Δt of a clock of the continuous plant simulator.

Dashed rectangular blocks in FIG. 6 represent separate threads of the simulation program. In a multi-core or multi-processor environment, preferably the individual threads are assigned to separate cores or processors.

As illustrated in FIG. 6, the hybrid peripherals 602b, 604b and 606b function as interfaces between CPU emulators 602a, 604a and 606a, respectively, and the bridges 608, 610 and 612, respectively, for the ECU emulators 602, 604 and 606, respectively. The hybrid peripherals 602b, 604b and 606b as modules are controlled so as to operate across the threads in which the plant simulators in which the plant simulators and the bridges 608, 610 and 612 exist and operate and the threads in which the ECU emulators 602, 604 and 606 operate. The name "hybrid" of the hybrid peripherals is derived from the fact that they are such coresident existences. Specifically, a portion of each hybrid peripheral exists within the same thread as the ECU emulator 602, 604 and 606 and another portion of the hybrid peripheral exists in the same thread as the plant simulator.

As illustrated, the hybrid peripherals 602b, 604b and 606b include shared memories 602c, 604c and 606c, respectively, for data read and write. The memories 602c, 604c and 606c are preferably areas of the main memory 506. Data can be read from and written on the memories by blocks making up the hybrid peripherals, and the ECU emulators.

Figure 7:
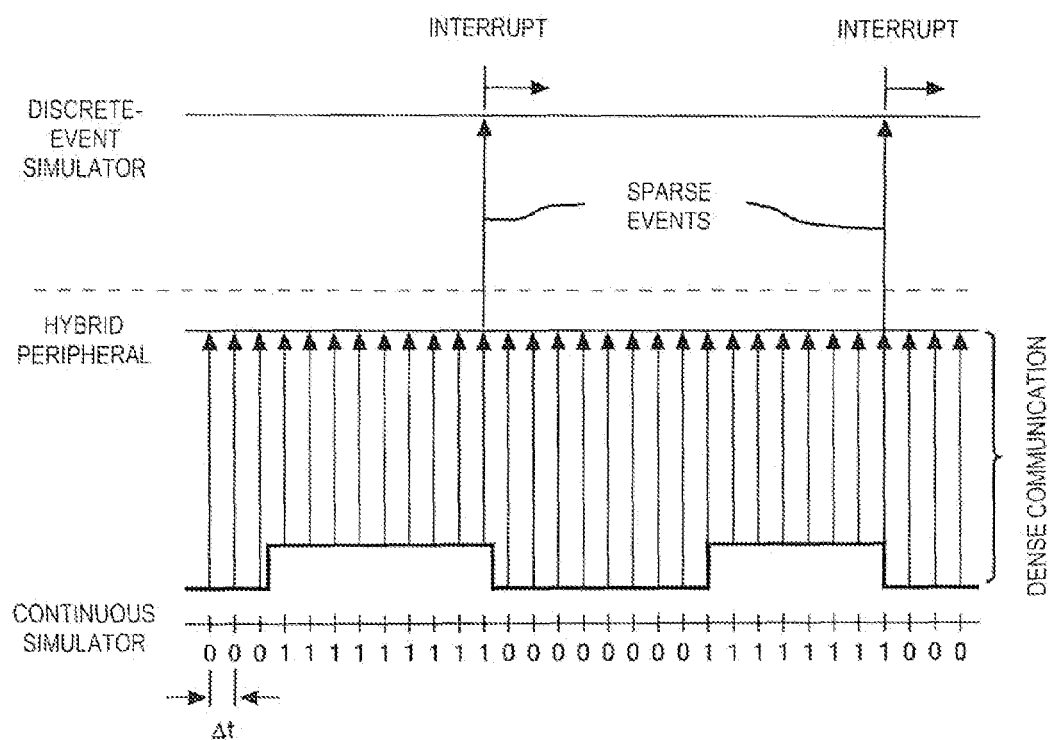
FIG. 7 illustrates a timing chart of the simulation system in FIG. 6.

FIG. 7 schematically illustrates a timing chart for the simulation system illustrated in the functional block diagram of FIG. 6. As illustrated, a continuous simulator such as a plant simulator and a hybrid peripheral communicate with each other at clock intervals Δt and therefore the communication is dense. However, according to the present invention, since the plant simulator and a portion of the hybrid peripheral are within the same thread, inter-thread communication does not occur between them and excessive communication cost is not incurred.

On the other hand, communication between the hybrid peripheral and the ECU emulator, which is a discrete-event simulator, occurs only at the timings of interrupts in the discrete-event simulator or scheduled, sparse timings. Communication from the hybrid peripheral to the ECU emulator is accomplished by transmission of an event signal.

Figure 8:
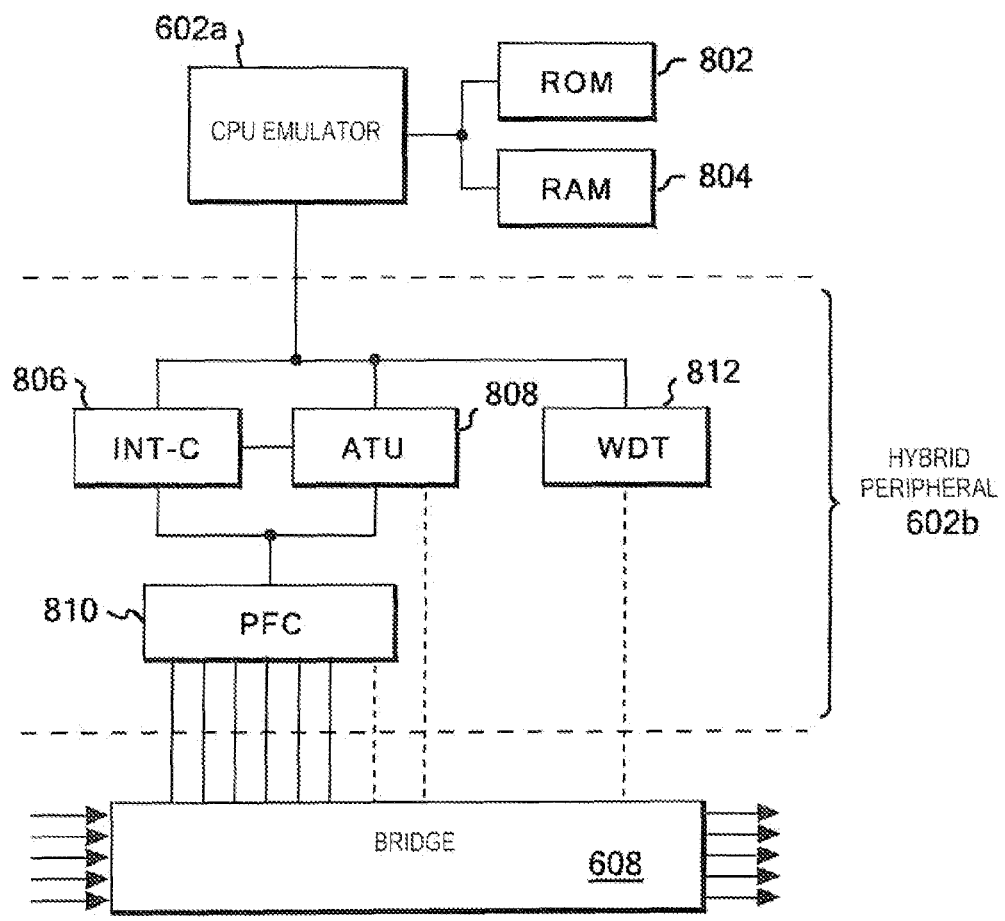
FIG. 8 illustrates a more detailed functional block diagram of the simulation system according to the embodiment of the present invention.

FIG. 8 illustrates a more detailed function block diagram of the simulation system. It should be understood that while only the block diagram relating to the ECU emulator 602 and the bridge 608 are illustrated, the block diagram is the same for the ECU emulators 604, 606 and the bridges 610, 612.

In FIG. 8, a ROM 802 and a RAM 804 are connected to the CPU emulator 602a. Since the simulation system described herein is basically an SILS, all functional blocks are implemented by software modules. Accordingly, the ROM 802 is just a set of constant declarations and the RAM 804 is a memory area allocated in the main memory 506.

Operation of the CPU emulator 602a may be execution of a binary code generated by reassembling a code generated by disassembling a binary code of an original emulator program or may be execution of binary instructions of an emulator program while converting the instructions stepwise in sequence.

As illustrated in FIG. 8, the hybrid peripheral 602b includes an interrupt controller (INT-C) 806, an advanced timer unit (ATU) 808, a pin function controller (PFC) 810, and a watch dog timer (WDT) 812.

It should be understood that the configuration including the INT-C 806, the ATU 808, the PFC 810 and the WDT 812 is one exemplary configuration of the hybrid peripheral 602b and the configuration of the hybrid peripheral is not limited to this.

The bridge 608 uses a variable mapping function to convert a signal input to the bridge 608 to a value to be provided to a pin of the PFC 810. The conversion can be represented by a C-like pseudo code, for example, as given below:

```
switch (link_type) {
case NE_PULSE:
    data.pi0 = link_value;
    break;
case A_F:
```

-continued

```
data.pe23 = link_value;
break;
...
}
```

That is, a value given to link_type provides the value to an element of a different structure, "data". Here, NE_PULSE is a pulse representing the RPM of an engine. In one example of real vehicle, 24 pulses occur per rotation of the crankshaft. A_F is air-fuel ratio, which is the ratio of the amount of air to the amount of fuel in the cylinder. It should be understood that these are illustrative only and there are many other signals in practice.

The PFC 810 includes the function of multiplexing data provided from the bridge 608 as a variable corresponding to the pin by the variable mapping function and providing the resulting data to the INT-C 806 or the ATU 808.

The INT-C 806 sends an event to the CPU emulator 602a in response to a change of a value or state provided to the PFC 810 in each clock interval. The event includes a parameter value provided from the PFC 810.

A time instant of the ATU 808 is updated according to a signal from the bridge. On the other hand, the CPU emulator 602a sets start timing and duration in the ATU 808 on the basis of the result of computation by the CPU emulator 602a. The ATU 808 generates pulses based on the start timing and the duration received and sends the pulses to the continuous system in time slices. Examples of timing and duration calculated in this way include the start timing and duration of fuel injection.

The WDT 812 is a timer that constantly counts up and, in response to a signal from the CPU emulator 602a, clears its count value. If the count value exceeds a threshold value because the WDT 812 has received no signal from the CPU emulator 602a for a predetermined period of time, the WDT 812 outputs a signal indicating that the CPU emulator 602a is not properly operating.

Figure 9:
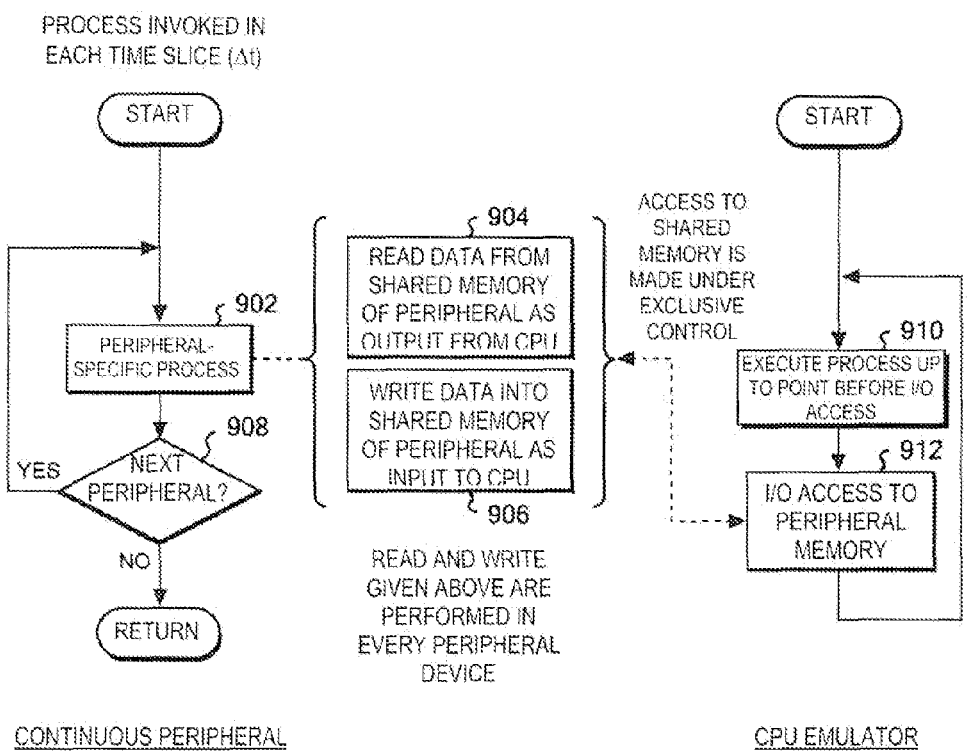
FIG. 9 illustrates flowcharts of process of operations of a continuous system and a hybrid peripheral.

FIG. 9 is a flowchart of a process of operations of the hybrid peripheral 602b and the CPU emulator 602a. It should be understood that operations of the hybrid peripheral 604b and the CPU emulator 604a are substantially the same as the operations. The hybrid peripheral 602b and the CPU emulator 602a will be described here as a representative example.

The process is invoked in each time slice Δt. The process can be said to be asynchronous in that the discrete-event simulator does not synchronize to a pulse of the continuous simulator.

Figure 10:
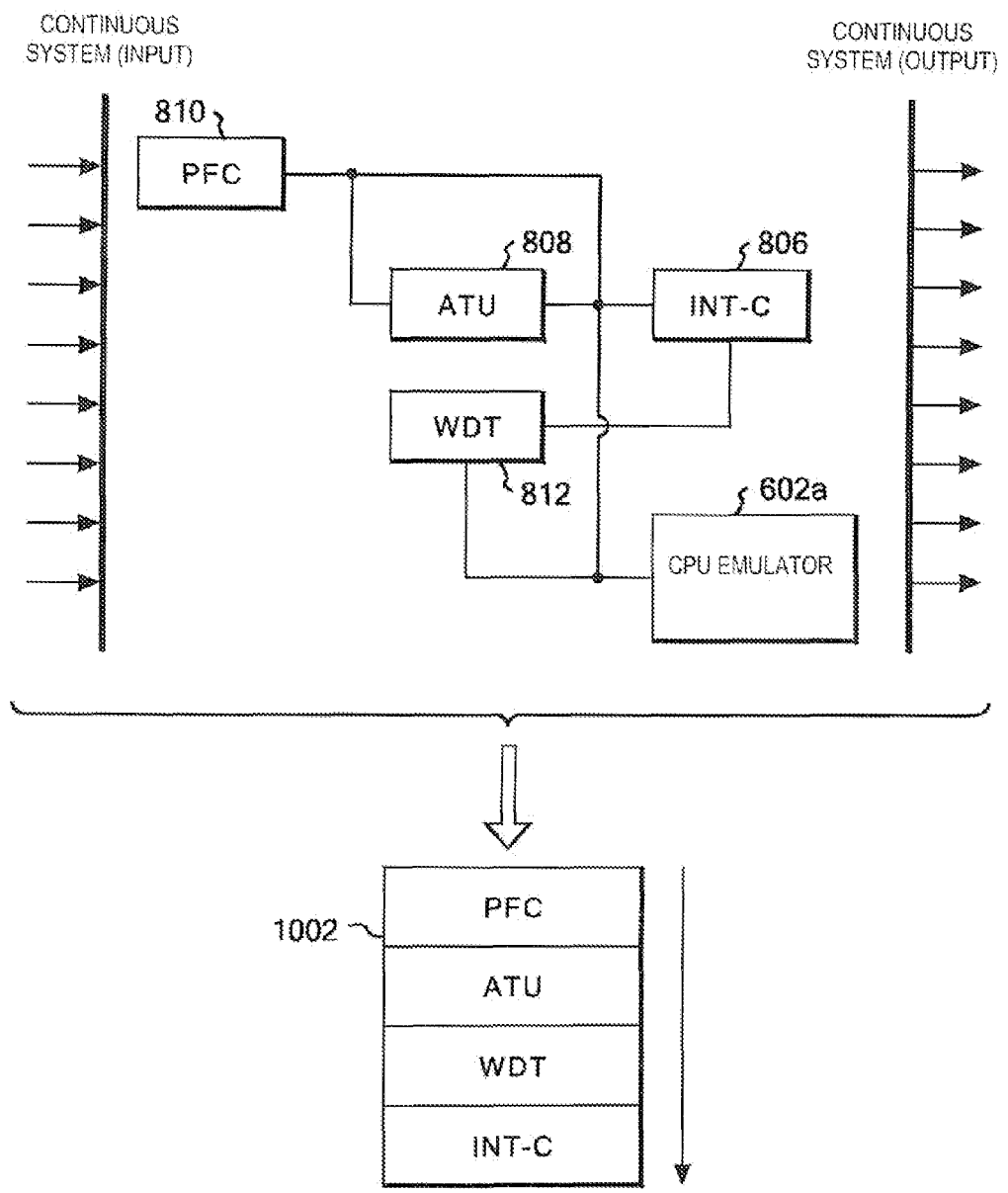
FIG. 10 illustrates an ordered list of components of the hybrid peripheral.

At steps 902 and 908 in FIG. 9, processes specific to component blocks making up the peripheral are performed in the order of the ordered component blocks of the peripheral. The term "component block" here refers to the INT-C 806, ATU 808, PFC 810, and WDT 812 in the example in FIG. 8. The order is determined according to an ordered list 1002 as illustrated in FIG. 10. The list is preferably provided in a predetermined location in the main memory 506. The list indicates the order is PFC→ATU→WDT→INT-C. FIG. 10 also indicates that the process should be performed in the order on the list, from the input to output of the continuous system.

In particular, step 902 includes step 904 in which data is read from the shared memory 602c of the hybrid peripheral 602b as an output from the CPU emulator 602a and step 906 in which data is written over data in the shared memory 602c of the hybrid peripheral 602b as an input from the CPU emulator 602a.

When the process is completed for all component blocks, the process of the hybrid peripheral 602b (in particular the continuous system portion) ends.

On the other hand, the CPU emulator 602a performs the process at step S910 up to the point immediately before I/O access. At step 912, the CPU emulator 602a makes I/O access to the shared memory 602c of the hybrid peripheral 602b. During the access to the shared memory 602c, exclusive control is performed to prevent any other process block from overwriting a value in the shared memory 602c.

Figure 11:
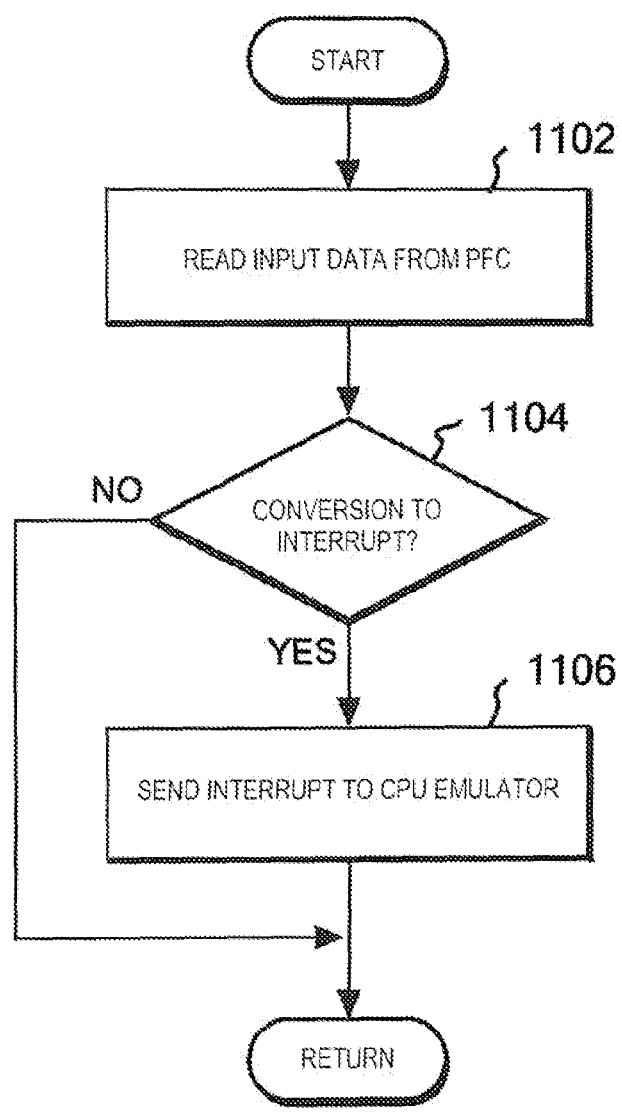
FIG. 11 illustrates a flowchart of a process of operation of an interrupt controller.

FIG. 11 illustrates a flowchart of a process performed by the INT-C 806 of the hybrid peripheral 602b. The process is the process specific to INT-C 806 performed at peripheral-component-block-specific process step 910 of FIG. 9. At step 1102 of FIG. 11, the INT-C takes in input data from the PFC 810. At step 1104, the INT-C determines whether or not the input data is to be converted to an interrupt. For example, a value previous to a certain value may be held and the determination may be made on the basis of whether or not the value has been changed from the previous value. Typically, a falling edge of a pulse is detected.

If the INT-C determines to convert the input data to an interrupt, the INT-C sends an interrupt event message to the CPU emulator at step 1106, and then the process will end.

Figure 12:
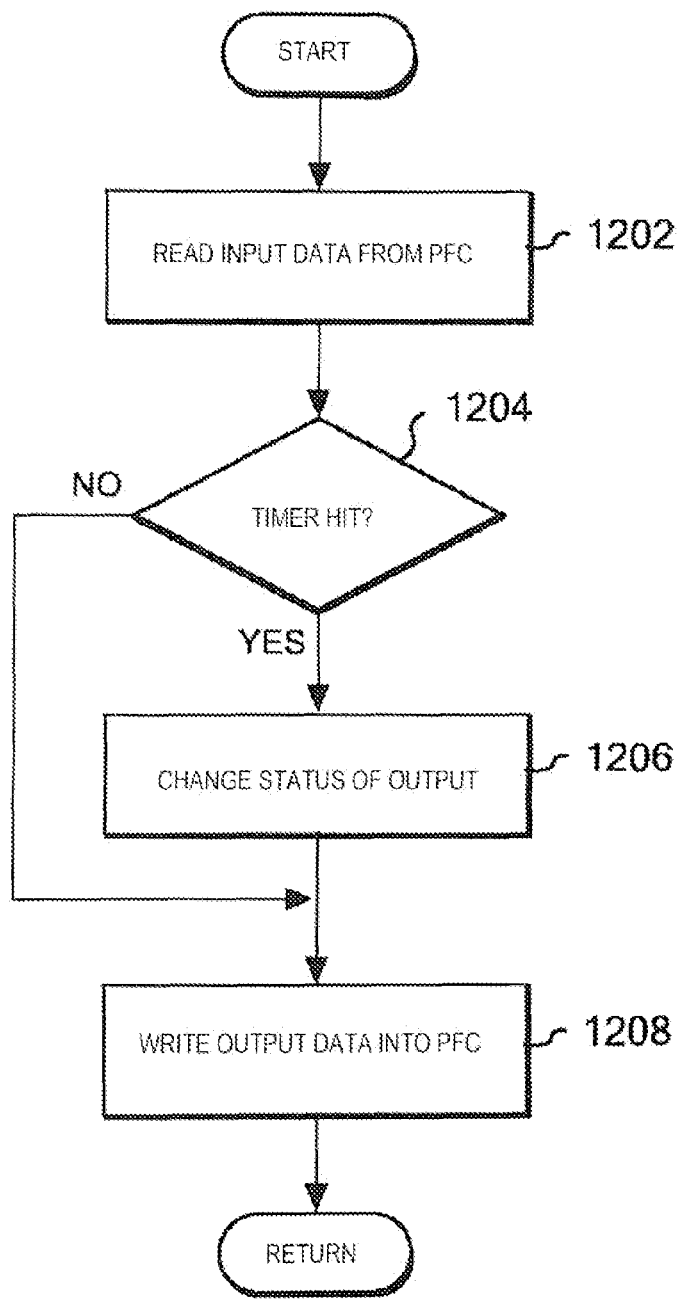
FIG. 12 illustrates a flowchart of a process of operation of an advanced timer unit.

FIG. 12 illustrate a flowchart of the ATU 808 of the hybrid peripheral 602b. The process is specific to the ATU 808 performed at the peripheral-component-block-specific process step 910 of FIG. 9. At step 1202 of FIG. 12, the ATU takes in input data from the PFC.

At step 1204, the ATU determines whether or not the timer has hit, that is, the value of the timer has reached a predetermined value. If so, the ATU changes the status of the output at step 1206; otherwise, the process immediately proceeds to step 1208.

Then, at step 1208, the ATU writes the output data in the PFC, and then the process will end.

More specifically, start time and duration can be set in the ATU 808 from the CPU emulator 602a. A timer hit at step 1204 means that it is within the duration from the start time. The ATU 808 outputs a logical 1, for example, during the duration from the start time through the PFC and outputs a logical 0 in other times.

Figure 13:
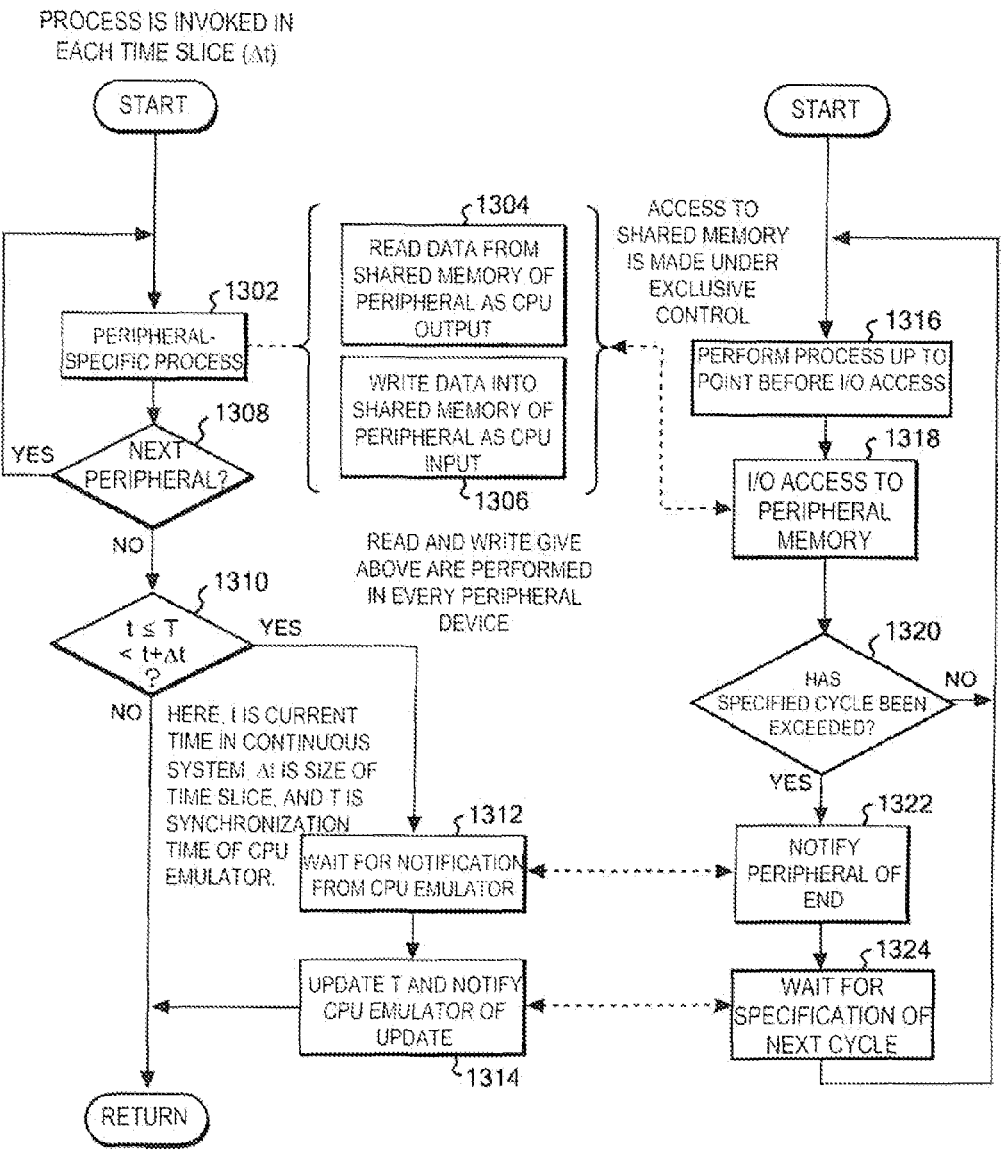
FIG. 13 illustrates flowcharts of process of operations of a continuous system and a hybrid peripheral in another embodiment.

FIG. 13 illustrates a flowchart of a process according to another embodiment relating to process of operations between a peripheral and an ECU emulator. The process of the embodiment differs from the process in FIG. 9 in that a synchronization process is performed in each specified cycle in the embodiment. The process in the flowchart of FIG. 13 is invoked in each time slice Δt. The embodiment is employed when a software timer (time calculation) is used in a discrete system. Operation of the software timer is guaranteed by synchronization at intervals smaller than the minimum granularity of the software timer.

At steps 1302 and 1308 in FIG. 13, processes specific to component blocks making up the peripheral are performed in the order of the ordered component blocks of the peripheral. The term "component block" here refers to the INT-C 806, ATU 808, PFC 810, and WDT 812 in the example in FIG. 8. The order is determined according to an ordered list 1002 as illustrated in FIG. 10. The list is preferably provided in a predetermined location in the main memory 506. The list indicates the order is PFC→ATU→WDT→INT-C. FIG. 10 also indicates that the process should be performed in the order on the list, from the input to output of the continuous system.

Processes specific to the INT-C 806 and ATU 808 are performed in the same way as the processes described with respect to FIGS. 11 and 12, respectively.

In particular, step 1302 includes step 1304 in which data is read from the shared memory 602*c* of the hybrid peripheral 602*b* as an output from the CPU emulator 602*a* and step 1306 in which data is written over data in the shared memory 602*c* of the hybrid peripheral 602*b* as an input from the CPU emulator 602*a*.

When the process is completed for all component blocks, the process of the hybrid peripheral 602*b* proceeds to step 1310, where determination is made as to whether or not t≤T<t+Δt. If not, the process immediately ends. Here, t represents the current time in the continuous system, Δt represents the size of a time slice, and T represents the synchronization time of the CPU emulator.

If it is determined at step 1310 that t≤T<t+Δt, the hybrid peripheral 602*b* waits for a notification from the CPU emulator 602*a* at step 1312. Upon arrival of the notification, the hybrid peripheral 602*b* updates T and notifies the CPU emulator 602*a* of the update at step 1314.

On the other hand, the CPU emulator 602*a* performs the process at S1316 up to the point immediately before I/O access. At step 1318, the CPU emulator 602*a* makes I/O access to the shared memory 602*c* of the hybrid peripheral 602*b*. During the access to the shared memory 602*c*, exclusive control is performed to prevent any other process block from overwriting a value in the shared memory 602*c*.

At step 1320, determination is made as to whether the specified cycle has ended or not. If not, the process returns to step 1316.

When it is determined at step 1320 that the specified cycle has ended, the CPU emulator 602*a* notifies the hybrid peripheral 602*b* of the end of the cycle at step 1322. The notification is the notification from the CPU emulator 602*a* at step 1312 described above.

At step 1324, the CPU emulator 602*a* waits for specification of the next cycle, which is the notification at step 1314 described above. Then the process returns to step 1316.

While particular embodiments of the present invention have been described with respect to multiple simulation systems for automobile, it will be apparent to those skilled in the art that the present invention is not limited to the particular embodiments but is applicable to simulation systems for electronic machine control systems in general.

While a peripheral portion of an ECU emulator and a continuous system exist within the same thread in the embodiments described above, they may exist in a wider unit, a process, that can be allocated to a single processor or core.

That which is claimed is:

1. A simulation system performing a simulation by processing on a computer, the simulation system comprising:
   a continuous simulator which operates with continuous pulses;
   a discrete-event simulator which operates with a discrete event message; and
   a peripheral means for converting a continuous pulse signal from the continuous simulator to an event message and sending the event message to the discrete-event simulator;
   wherein the continuous simulator and at least a portion of the peripheral means are controlled so as to operate within the same process or the same thread.

2. The simulation system according to claim 1, wherein the peripheral means further comprises the function of converting an event message signal coming from the discrete-event simulator to a continuous clock signal and sending the continuous clock signal to the continuous simulator.

3. The simulation system according to claim 1, wherein an event of the discrete-event simulator is an interrupt.

4. The simulation system according to claim 1, wherein the peripheral means and the discrete-event simulator asynchronously communicate with each other.

5. The simulation system according to claim 4, wherein the peripheral means comprises a memory from which data can be read and onto which data can be written, and the peripheral means and the discrete-event simulator exchange data by reading data from and writing data onto the memory.

6. The simulation system according to claim 1, wherein the peripheral means performs communication in synchronization in each specified cycle longer than a period of the continuous clock signal.

7. The simulation system according to claim 1, wherein the simulation system is an automobile simulation system, the continuous simulator comprises an engine simulator, and the discrete-event simulator comprises an electronic control unit (ECU) emulator for controlling the engine simulator.

8. A simulation method for performing a simulation by processing on a computer, the simulation method comprising the steps of:
   causing a continuous simulator which operates with continuous pulses to operate;
   causing a discrete-event simulator which operates with a discrete event message to operate; and
   causing a peripheral means for converting a continuous pulse signal coming from the continuous simulator to an event message and sending the event message to the discrete-event simulator to operate;
   wherein the continuous simulator and the peripheral means are controlled so as to operate within the same process or the same thread.

9. The simulation method according to claim 8, wherein the peripheral means further comprises the function of converting an event message signal coming from the discrete-event simulator to a continuous clock signal and sending the continuous clock signal to the continuous simulator.

10. The simulation method according to claim 8, wherein an event of the discrete-event simulator is an interrupt.

11. The simulation method according to claim 8, wherein the peripheral means and the discrete-event simulator asynchronously communicate with each other.

12. The simulation method according to claim 8, wherein the peripheral means performs communication in synchronization in each specified cycle longer than a period of the continuous clock signal.

13. The simulation method according to claim 8, wherein the simulation method is an automobile simulation method, the continuous simulator comprises an engine simulator, and the discrete-event simulator comprises an electronic control unit (ECU) emulator for controlling the engine simulator.

14. An article of manufacture tangibly embodying computer readable instructions which, when implemented, cause a computer to carry out the steps of a method comprising:
   causing a continuous simulator which operates with a continuous pulse to operate;
   causing a discrete-event simulator which operates with a discrete event message to operate; and
   causing a peripheral means for converting a continuous pulse signal coming from the continuous simulator to an event message and sending the event message to the discrete-event simulator to operate;

wherein the continuous simulator and the peripheral means are controlled so as to operate within the same process or the same thread.

15. The article of manufacture according to claim 14, wherein the peripheral means further comprises the function of converting an event message signal coming from the discrete-event simulator to a continuous clock signal and sending the continuous clock signal to the continuous simulator.

16. The article of manufacture according to claim 14, wherein the peripheral means and the discrete-event simulator asynchronously communicate with each other.

17. The article of manufacture according to claim 14, wherein an event of the discrete-event simulator is an interrupt.

18. The article of manufacture according to claim 14, wherein the peripheral means performs communication in synchronization in each specified cycle longer than a period of the continuous clock signal.

19. The article of manufacture according to claim 14, wherein the instructions are for an automobile ECU simulation program, the continuous simulator comprises an engine simulator, and the discrete-event simulator comprises an ECU emulator for controlling the engine simulator.

* * * * *